United States Patent
Kawashima

(10) Patent No.: US 8,008,717 B2
(45) Date of Patent: Aug. 30, 2011

(54) SEMICONDUCTOR DEVICE

(75) Inventor: Yoshiya Kawashima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 202 days.

(21) Appl. No.: 12/498,774

(22) Filed: Jul. 7, 2009

(65) Prior Publication Data
US 2010/0001341 A1    Jan. 7, 2010

(30) Foreign Application Priority Data

Jul. 7, 2008  (JP) .................. 2008-177269

(51) Int. Cl.
*H01L 29/78* (2006.01)
(52) U.S. Cl. ............... 257/334; 257/367; 257/E29.005; 257/E29.262
(58) Field of Classification Search .................. 257/334, 257/367, E29.005, E29.262
See application file for complete search history.

(56) References Cited

FOREIGN PATENT DOCUMENTS
JP    2002-073669    3/2002
JP    2006-310621    9/2006

OTHER PUBLICATIONS

200V Trench Filing Type Super Junction MOSFET with Orthogonal Gate Structure, pp. 27-40, dated May 27-30, 2007.

*Primary Examiner* — Evan Pert
(74) *Attorney, Agent, or Firm* — Young & Thompson

(57) ABSTRACT

A semiconductor device of the present invention has a first-conductivity-type substrate having second-conductivity-type base regions exposed to a first surface thereof; trench gates provided to a first surface of the substrate; first-conductivity-type source regions formed shallower than the base regions; a plurality of second-conductivity-type column regions located between two adjacent trench gates in a plan view, while being spaced from each other in a second direction normal to the first direction; the center of each column region and the center of each base contact region fall on the center line between two trench gates; and has no column region formed below the trench gates.

4 Claims, 15 Drawing Sheets

SEMICONDUCTOR DEVICE

This application is based on Japanese patent application No. 2008-177269, the content of which is incorporated hereinto by reference.

BACKGROUND

1. Technical Field

The present invention relates to a semiconductor device capable of lowering the ON-resistance and of elevating the avalanche resistance of a transistor.

2. Related Art

A vertical transistor has been known as one type of high-voltage power MOS field effect transistor (power MOSFET). Important characteristics of the power MOSFET include lowering of the ON-resistance and elevation of the breakdown resistance. One known structure capable of reconciling these requirements is exemplified by super-junction structure (referred to as "SJ structure", hereinafter), described in Proceedings of the 19th International Symposium on Power Semiconductor Devices & IC's, P. 37, 2007.

FIG. 14 is a plan view illustrating an exemplary configuration of a transistor having the SJ structure, and FIG. 15 is a sectional view taken alone line A-A' in FIG. 14. The transistor has a first-conductivity-type semiconductor substrate 500, an epitaxial layer 510, base regions 520, trench gate electrodes 530, source regions 540, column regions 550, an insulating film 600, source electrode(s) 610, and drain electrode(s) 620. The epitaxial layer 510 is formed over the surface of the semiconductor substrate 500, has a first conductivity type, and functions as an electric field moderating layer. Each base region 520 has a second conductivity type, and is formed over the surface of the epitaxial layer 510. Each trench gate electrode 530 is buried in the surficial portion of the epitaxial layer 510. A gate insulating film is provided between each trench gate electrode 530 and the epitaxial layer 510. Each source region 540 has a first conductivity type, and is formed in each base region 520. Each column region 550 has a second conductivity type, and is formed in the epitaxial layer 510, more specifically in a region thereof below each base region 520. In a plan view, the trench gate electrodes 530 and the column regions 550 are linearly extended in parallel with each other.

Each source electrode 610 is formed over the epitaxial layer 510, and is connected to the base regions 520 and the source regions 540. The source electrodes 610 and the trench gate electrodes 530 are electrically isolated by the insulating film 600. The drain electrode 620 is provided on the back side of the semiconductor substrate 500.

In the semiconductor device illustrated in FIG. 14 and FIG. 15, when the transistor is turned off, having no bias voltage being applied between the trench gate electrodes 530 and the source electrodes 610, and when a reverse bias voltage is applied between the drain electrodes 620 and the source electrodes 610, a depletion layer spreads respectively at the interface between each base region 520 and the epitaxial layer 510, and at the interface between each column region 550 and the epitaxial layer 510. Since the interface between each column region 550 and the epitaxial layer 510 extends in the thickness-wise direction of the epitaxial layer 510 (vertical direction in FIG. 15), so that the depletion layer which resides at the interface spreads in the in-plane direction (transverse direction in FIG. 15) from the interface. Accordingly, the epitaxial layer 510 (including the column regions 550) is depleted over the entire region thereof, so that the breakdown voltage of the transistor is determined by the thickness of the epitaxial layer 510, irrespective of the impurity concentration of the epitaxial layer 510. The ON-resistance of the transistor may therefore be lowered by increasing the impurity concentration of the epitaxial layer 510, and the breakdown resistance of the transistor may be elevated by thickening the epitaxial layer 510.

Japanese Laid-Open Patent Publication No. 2002-076339 discloses also a configuration of a transistor having the SJ structure, in which a repetition pitch of the trenches filled with gate electrodes is made different from the pitch of arrangement of the parallel pn layers, that is, the column regions.

Japanese Laid-Open Patent Publication No. 2006-310621 discloses another SJ structure in which the column regions are provided also below the trench gates.

In a transistor having the SJ structure, the drain current of the transistor flows through the substrate (epitaxial layer, for example). Since the column regions have a conductivity type opposite to that of the substrate, the region allowing the drain current to flow therethrough will be narrowed if the occupied area of the column regions grows larger relative to the substrate, and thereby the ON-resistance of transistor may increase.

In addition, in a transistor having the SJ structure, current which generates in the process of breakdown may flow through the column region and the base region, to an electrode in contact with the base region. If the distance between the column region and the trench gate is short, the current which generated in the process of breakdown may flow through a region in the vicinity of the trench gate, and thereby the avalanche resistance may be degraded, because of thermal destruction ascribable to operation of parasitic bipolar transistors formed along the side faces of the trench gates, and dielectric breakdown ascribable to injection of carriers into the gate insulating film.

SUMMARY

In one embodiment, there is provided a semiconductor device comprising:

a substrate of a first conductivity type, having second-conductivity-type base regions exposed to a first surface thereof;

trench gates provided to the first surface of the substrate, disposed while being spaced from each other in a first direction in a plan view;

first-conductivity-type source regions formed to the first surface, to a depth shallower than the base regions; and a plurality of second-conductivity-type column regions formed in the substrate and under the base region, and located between two adjacent trench gates in a plan view, wherein, between two adjacent trench gates, the plurality of column regions are disposed while being spaced from each other in a second direction normal to the first direction, the center of each column region falls on the center line between two adjacent trench gates in the first direction, and the column regions are not formed under the trench gates.

According to the present invention, a plurality of column regions are disposed while being spaced from each other in the second direction normal to the first direction, and no column region is formed below the trench gates. Accordingly, the occupied area of the column regions relative to the substrate may be reduced, and thereby the ON-resistance of transistor may be lowered.

In the first direction, the center of each column region falls on the center line between two adjacent trench gates. By virtue of this configuration, the current which generates in the process of breakdown may be brought apart from the trench gates to a possibly maximum degree, and thereby the avalanche resistance of transistor may be elevated.

According to the present invention, the ON-resistance of transistor may be lowered, and the avalanche resistance may be elevated.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
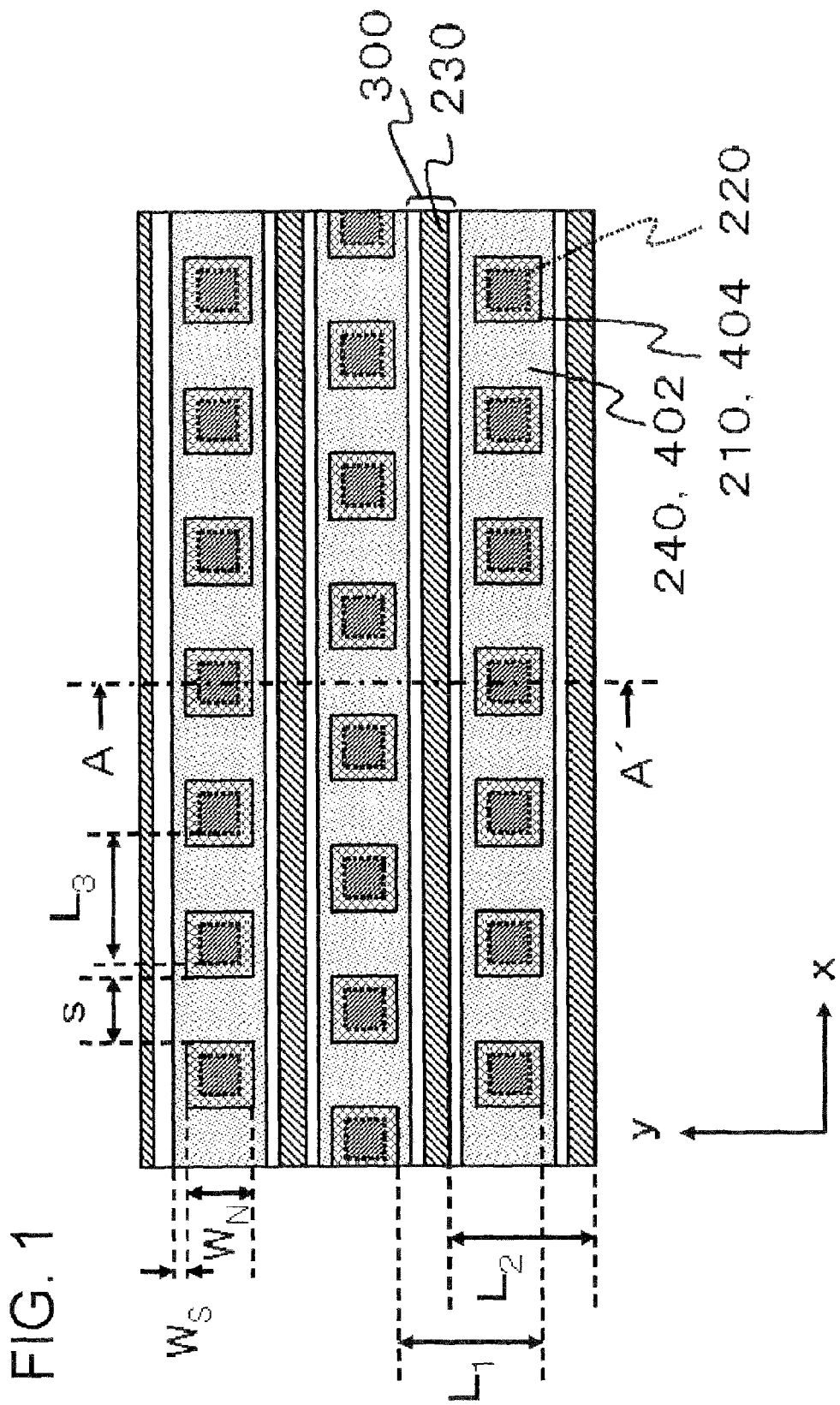
FIG. 1 is a plan view illustrating a semiconductor device according to a first embodiment.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings. Note that any similar constituents will be given with similar reference numerals in all drawings, and explanations therefor will not be repeated.

Figure 2:
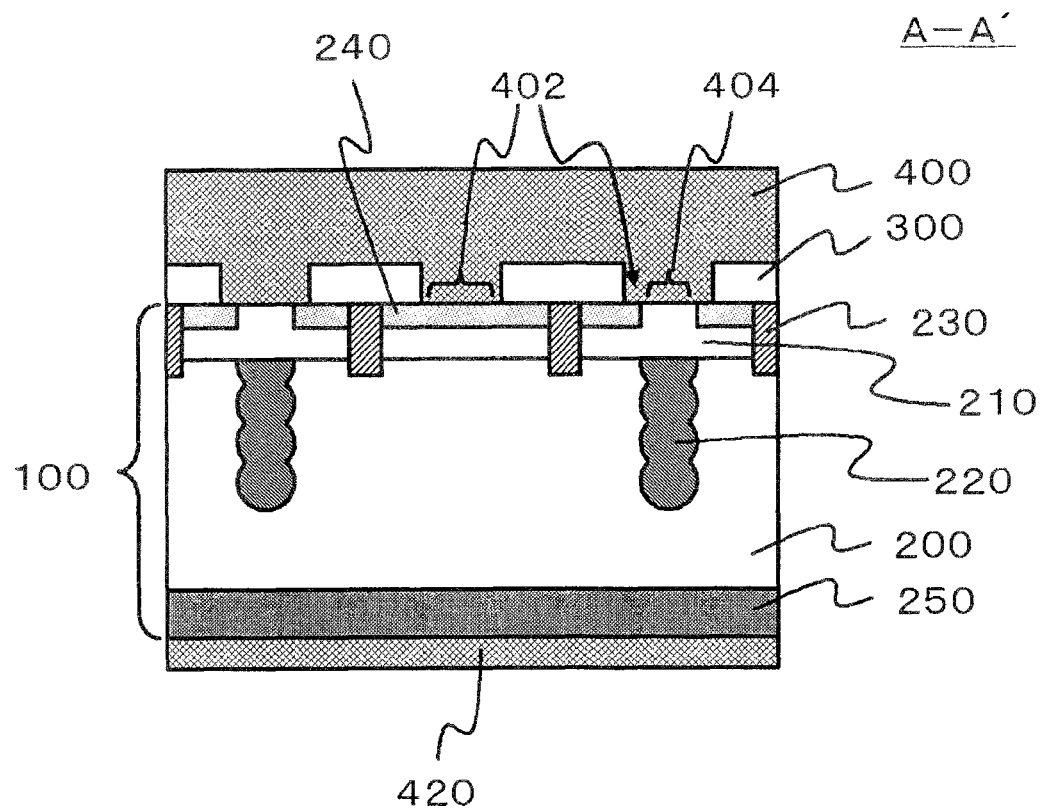
FIG. 2 is a sectional view taken along line A-A' in FIG. 1.

FIG. 1 is a plan view of a semiconductor device according to a first embodiment, and FIG. 2 is a sectional view taken along line A-A' in FIG. 1. The semiconductor device is a high-voltage transistor such as MOSFET and IGBT (insulated gate bipolar transistor), and has the super-junction structure. The semiconductor device has a substrate 100, a plurality of trench gates 230, source regions 240, a plurality of column regions 220, first electrodes 400, and a second electrode 420. The substrate 100 has a first conductivity type (n-type, for example), and has second-conductivity-type (p-type, for example). Base regions 210 are formed so as to expose to a first surface thereof. The plurality of trench gates 230 are provided to the first surface (top side) of the substrate 100, while being spaced from each other in a first direction (the y-direction in FIG. 1) in a plan view. Between the trench gates 230 and the substrate 100, there is formed a gate insulating film (not illustrated). The source regions 240 have a first conductivity type, formed in the surficial portions on the first surface side, to a depth shallower than the base regions 210. The plurality of column regions 220 have a second conductivity type, and are formed below the base regions 210. The column regions 220 are located between two adjacent trench gates 230 in a plan view, and in this embodiment, not overlapped with the source regions 240. The first electrodes 400 are provided on one surface side of the substrate 100, and are connected to the base regions 210 of the substrate 100, in base contact regions 404 located above the column regions 220.

As illustrated in FIG. 1, between every adjacent ones of the plurality of trench gates 230, the plurality of column regions 220 are disposed while being spaced from each other in a second direction (the x-direction in FIG. 1) normal to the first direction. In the y-direction in FIG. 1, the center of each column region 220 and the center of each base contact region 404 (in other words, the center of regions of the first electrode 400 brought into contact with the base regions 210) fall on the center line between two adjacent trench gates 230. As illustrated in FIG. 2, the column regions 220 are not formed below the trench gates 230.

The plurality of column region 220 is disposed in a staggered manner, while placing the trench gates 230 in between. Planar geometries of the column regions 220 and the base contact regions 404 are square, for example. The planar geometry of each column region 220 is slightly smaller than that of each base contact region 404. The width $W_N$ of each base contact region 404 is equal to the space "s" between the adjacent base contact regions 404 in the x-direction. Note that, the width $W_N$ may be different from the space "s". The interval of disposition $L_1$ of the column regions 220 in the y-direction is equal to the interval of disposition $L_3$ of the column regions 220 in the x-direction. Note again that the intervals of disposition $L_1$, $L_3$ may differ from each other. The interval of disposition $L_1$ of the column regions 220 herein is equal to the interval of disposition $L_2$ of the trench gates 230.

The first electrodes 400 are brought into contact with the substrate 100 in linear regions which correspond to gaps in the insulating film 300. The linear regions may be divided into source contact regions 402 and base contact regions 404. As described in the above, the first electrodes 400 are connected to the base regions 210 in the base contact regions 404, and connected to the source regions 240 in the source contact regions 402.

The width $W_N$ of each base contact region 404 is narrower than a portion of the distance between adjacent trench gates 230 such that there is a gap Ws ensured between each base contact region 404 and the insulating film 300 in the y-direction. These portions serve as the source contact regions 402. In the x-direction, also a portion S between adjacent base contact regions 404, that is, a portion above a region, between adjacent column regions 220, serves as each source contact region 402.

As illustrated in FIG. 2, the substrate 100 is configured by forming a first-conductivity-type epitaxial layer 200 over a surface of the first-conductivity-type semiconductor substrate 250. Over the top surface of the epitaxial layer 200, there are formed the base regions 210, the trench gates 230, and the source regions 240. Over the substrate 100, there is formed the insulating film 300 so as to be located over the trench gates 230 and therearound. By virtue of the insulating film 300 formed therein, the trench gates 230 are electrically isolated from the first electrodes 400. In this embodiment, the semiconductor substrate 250 functions as a drain, and on the back surface of which (on the surface opposite to the top surface), and the second electrode 420 is provided on the back surface (the surface opposite to the top surface) of the semiconductor substrate 250. The bottom of each column region 220 does not reach the semiconductor substrate 250, being remained buried in the epitaxial layer 200.

Next, operations and effects of the present invention will be explained. The plurality of column regions 220 are disposed so as to be spaced from each other in the x-direction in FIG. 1. The column regions 220 are not formed below the trench gates 230. As a consequence, the occupied area of the column regions 220 relative to the substrate 100 may be reduced as compared with the case where the column regions 220 are formed as a continuum in the x-direction, or the case where the column regions 220 are formed below the trench gates 230, and thereby the area allowing the drain current of transistor to flow therethrough may be widened. The ON-resistance of transistor may consequently be lowered.

For an exemplary case illustrated in FIG. 1, the area of the substrate 100 unoccupied by the column regions 220 is $(2W_S \times (W_N+S)+S \times W_N)/(2W_S \times (W_N+S))$ times as large as that for the case where the column regions 220 are formed as a continuum. For example, if the area increases by a factor of 4/3, the ON-resistance of the substrate 100 of the transistor decreases by a factor of 3/4.

In the process of breakdown, hole-electron pairs generate at the bottoms of the column regions 220, and current ascribable thereto may flow through the column regions 220 and the base regions 210 to the first electrode 400 over the base contact regions 404. In this embodiment, the center of each column region 220 and the center of each base contact region 404 fall on the center line between two adjacent trench gates 230 in the y-direction. Accordingly, the current which generates in the process of breakdown may be brought apart from the trench gates 230 to a maximum degree. As a consequence, dielectric breakdown of the gate insulating film, and thermal destruction ascribable to operation of parasitic bipolar transistors formed along the side faces of the trench gates 230 may be suppressed, and thereby the avalanche resistance of transistor may be elevated.

A region of the first surface of the substrate 100, fallen between two adjacent base contact regions 404 in the x-direction (a portion above a region fallen between every adjacent column regions 220) functions as the source contact region 402. Accordingly, the source contact regions 402 may be widened, and the path of the drain current of transistor may be widened.

Figure 3:
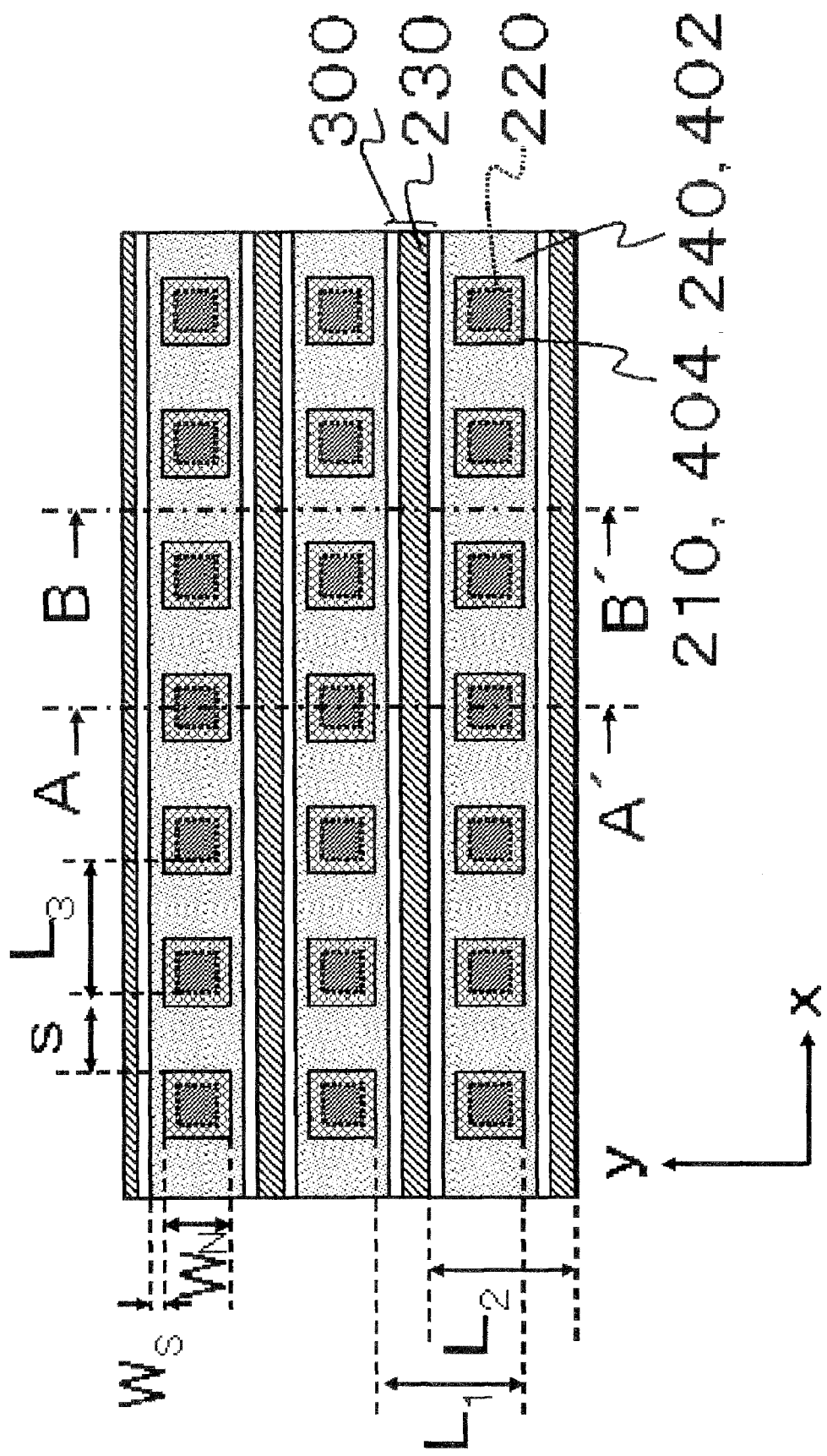
FIG. 3 is a plan view illustrating a semiconductor device according to a second embodiment.
Figure 4:
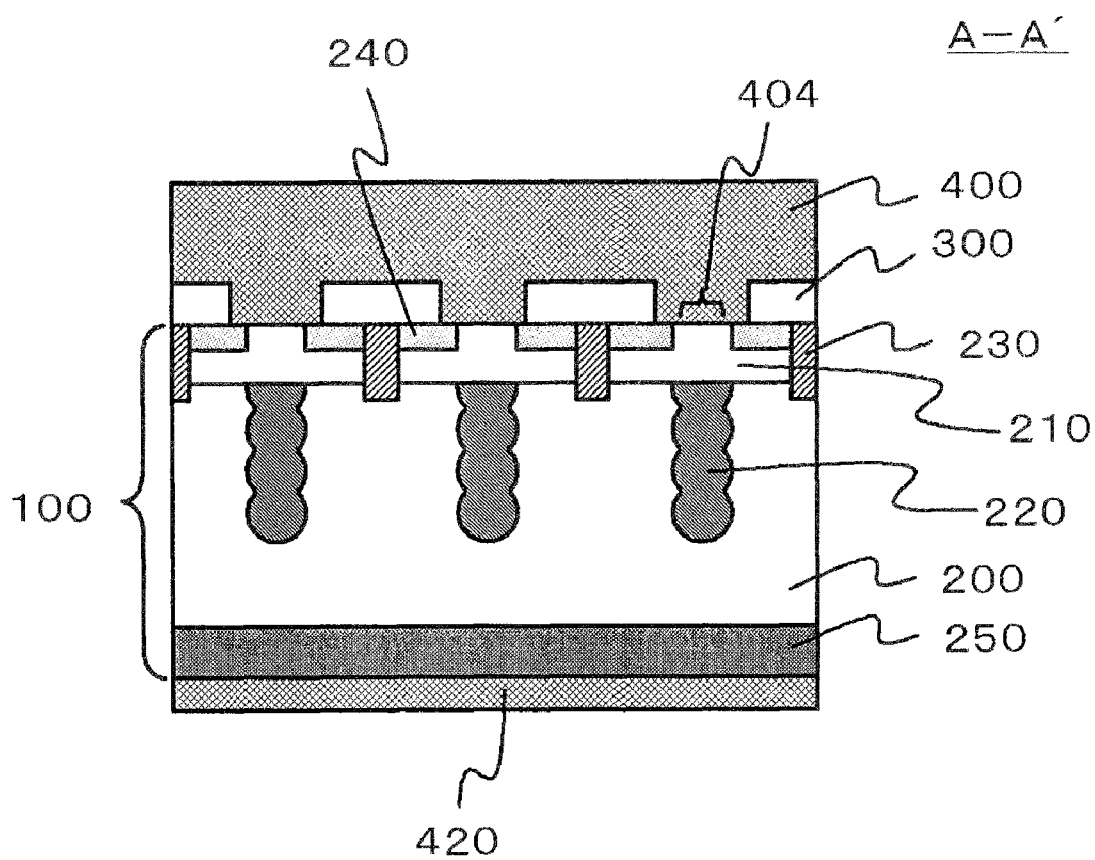
FIG. 4 is a sectional view taken along line A-A' in FIG. 3.
Figure 5:
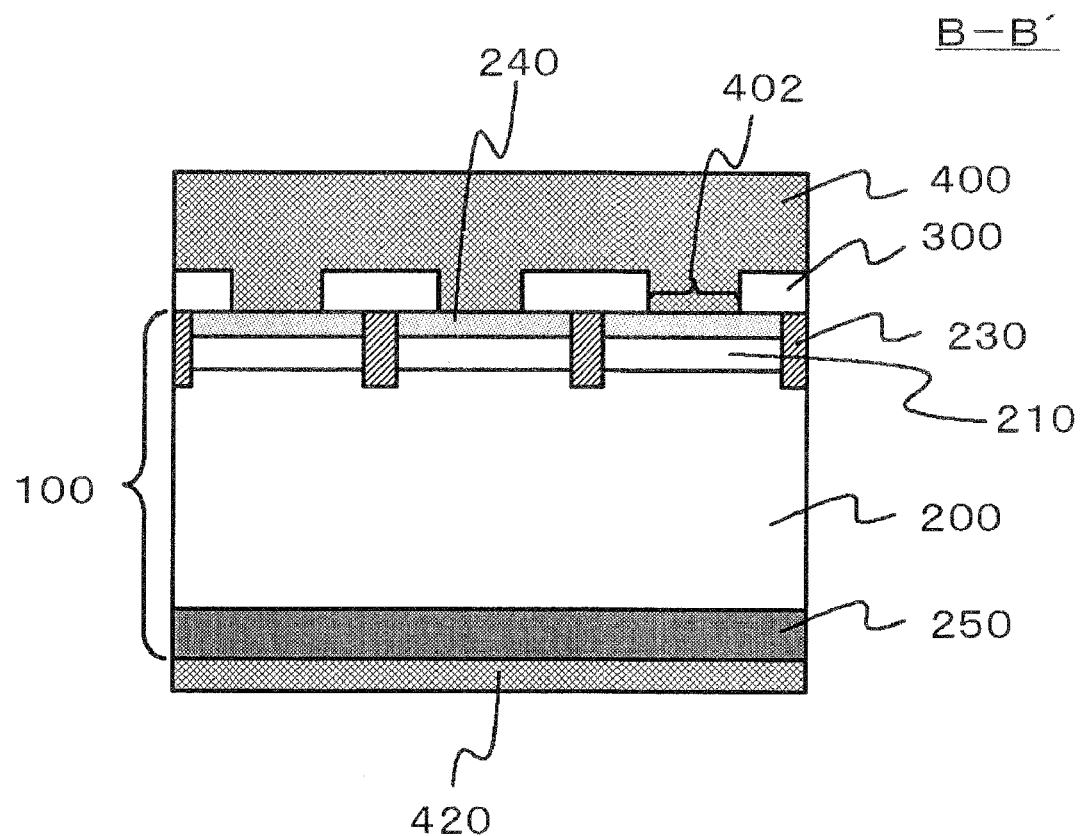
FIG. 5 is a sectional view taken along line B-B' in FIG. 3.

FIG. 3 is a plan view of a semiconductor device according to a second embodiment. FIG. 4 is a sectional view taken along line A-A' in FIG. 3, and FIG. 5 is a sectional view taken along line B-B' in FIG. 3. The semiconductor device is configured similarly to the first embodiment, except that the plurality of column regions 220 and the base contact regions 404 are disposed in-line in the y-direction of the drawing, while placing the trench gates 230 in between.

Effects similar to those in the first embodiment may be obtained, also by this embodiment.

Figure 6:
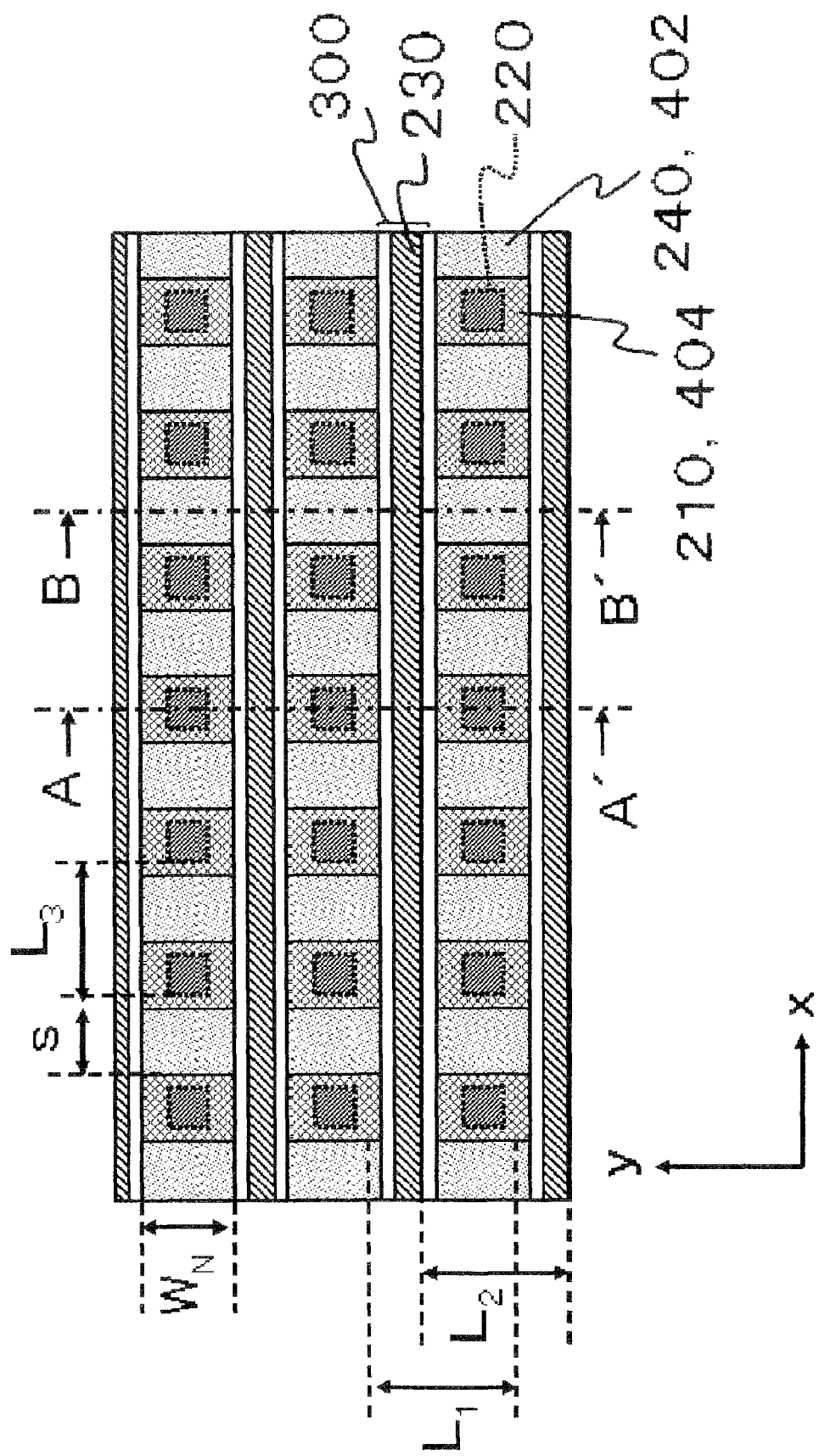
FIG. 6 is a plan view illustrating a semiconductor device according to a third embodiment
Figure 7:
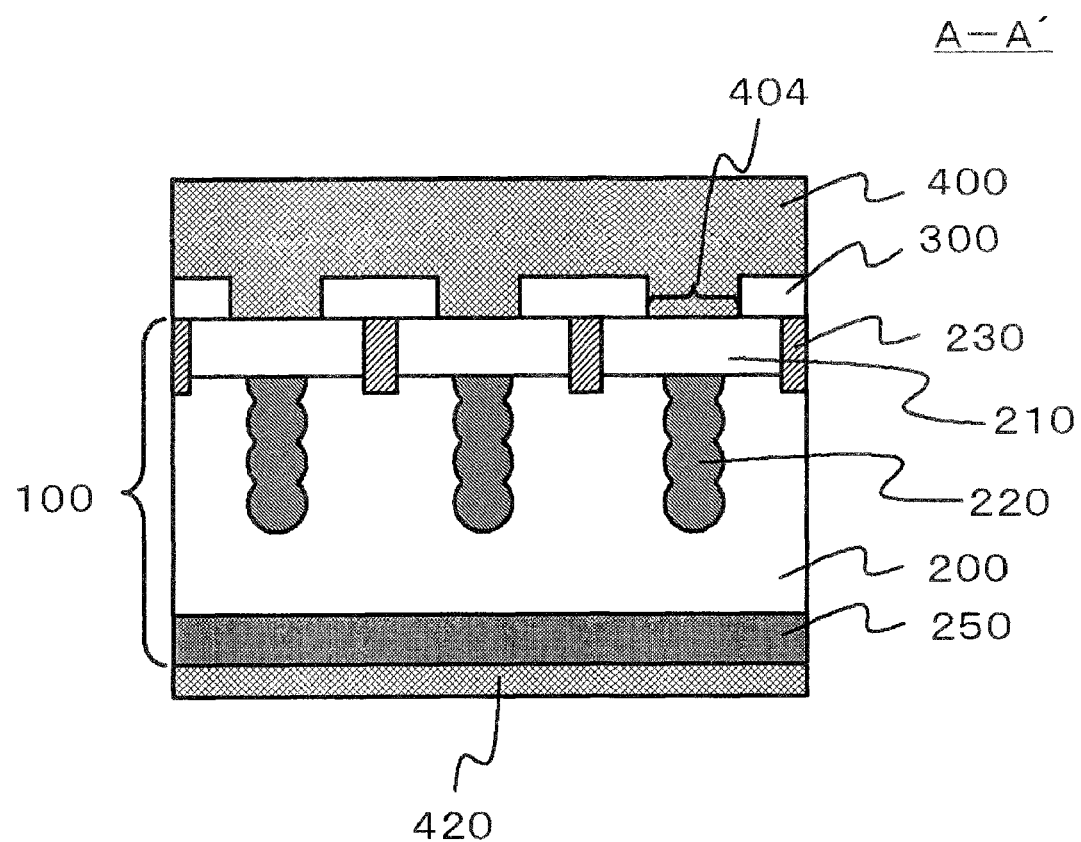
FIG. 7 is a sectional view taken along line A-A' in FIG. 6.
Figure 8:
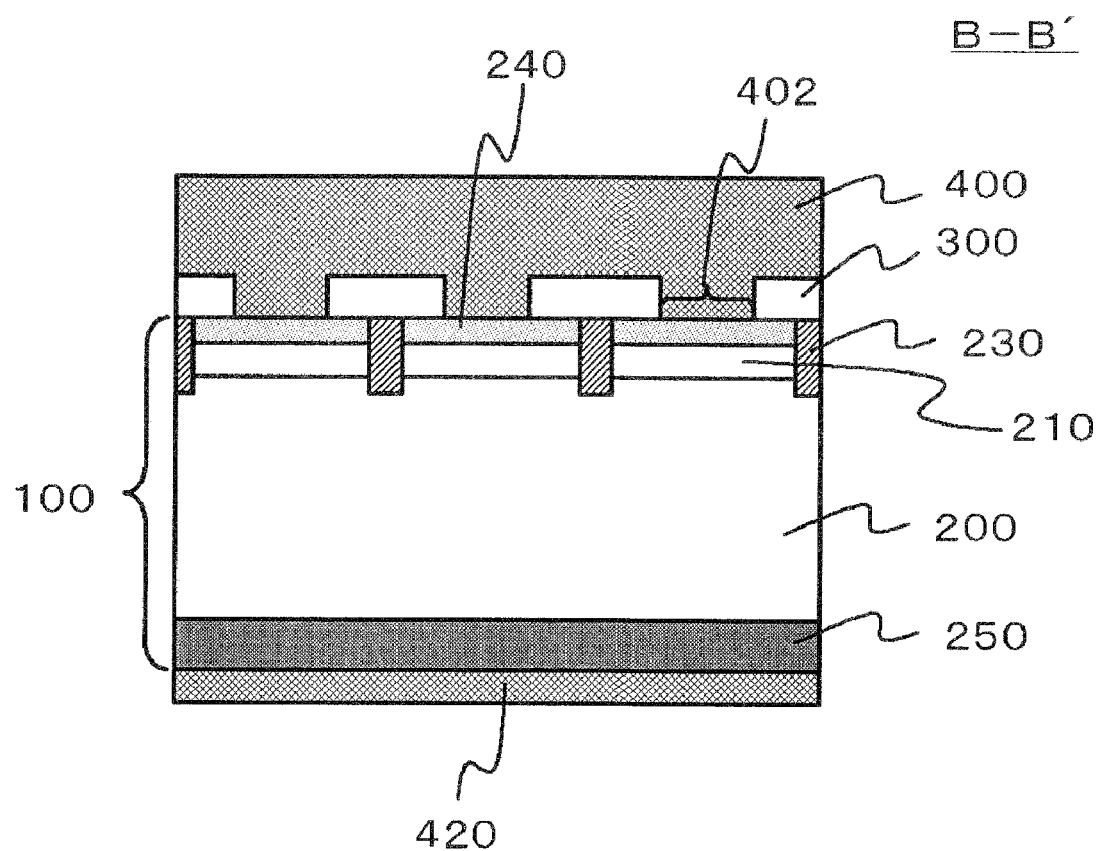
FIG. 8 is a sectional view taken along line B-B' in FIG. 6.

FIG. 6 is a plan view of a semiconductor device according to a third embodiment. FIG. 7 is a sectional view taken along line A-A' in FIG. 6, and FIG. 8 is a sectional view taken along line B-B' in FIG. 6. The semiconductor device is configured similarly to the second embodiment, except that the source regions 240 are not located between the column regions 220 and the trench gate 230 in the first direction (the y-direction in FIG. 6) in a plan view. More specifically, the width $W_N$ of the base contact regions 404 in this embodiment equals to the width of the region fallen between the adjacent trench gates 230, so that there is no gap between the base contact regions 404 and the insulating film 300 in the y-direction in FIG. 6.

Effects similar to those in the first embodiment may be obtained, again by this embodiment. There is no need of forming the source regions 240 between the column regions 220 and the trench gates 230 in the y-direction in FIG. 6. By virtue of this configuration, a mask pattern used for formation of the source regions 240 may be simplified as compared with that used in the second embodiment, and thereby the semiconductor device may more readily be shrunk in size. In particular for the case where the plurality of column regions 220 and the base contact regions 404 are disposed in-line in the y-direction in FIG. 6, while placing the trench gates 230 in between, the base contact region 404 and the source regions 240 are consequently disposed in an alternating manner, so that the shrinkage in size of the semiconductor device may be made particularly easier.

Figure 9:
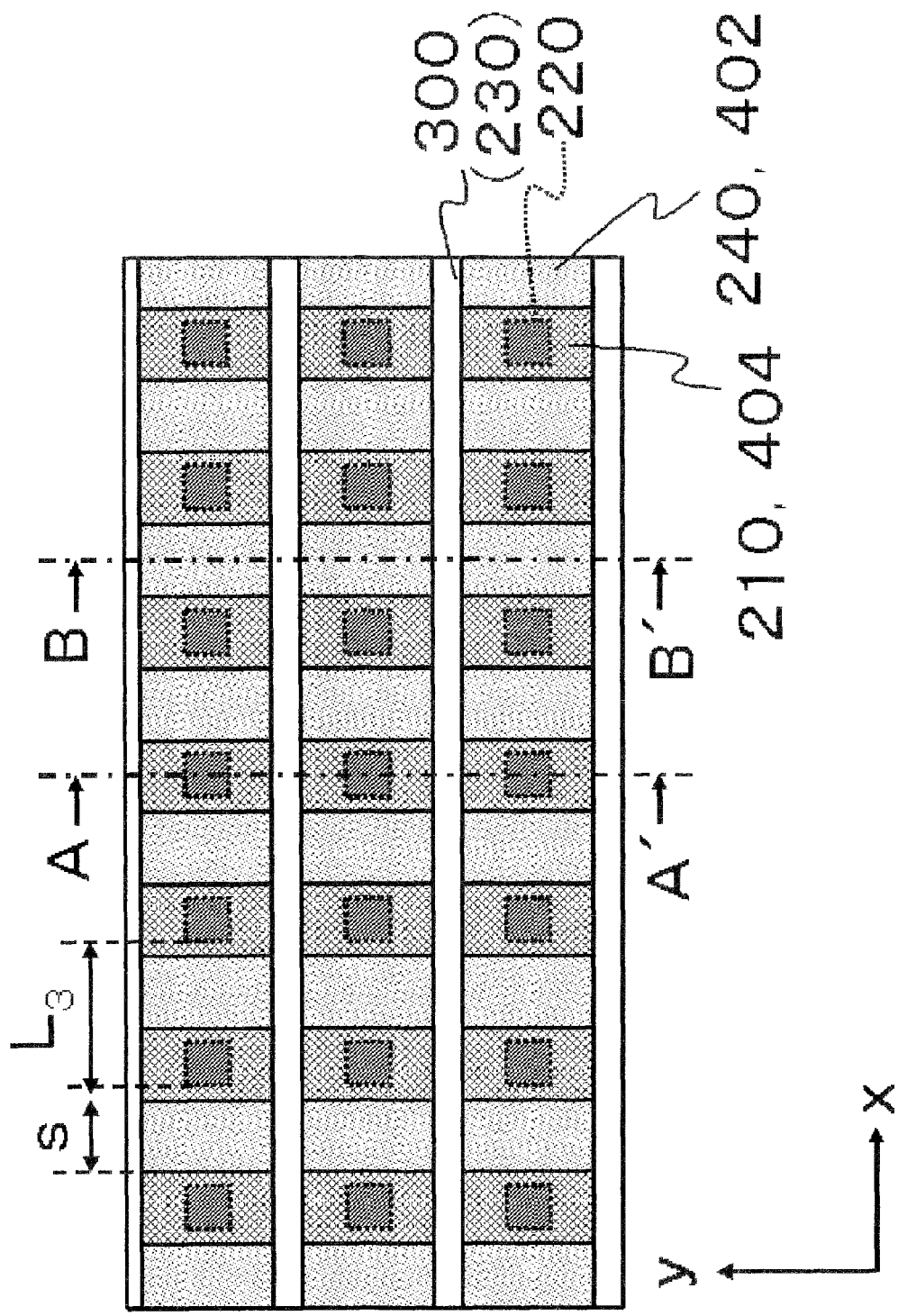
FIG. 9 is a plan view illustrating semiconductor device according to a fourth embodiment.
Figure 10:
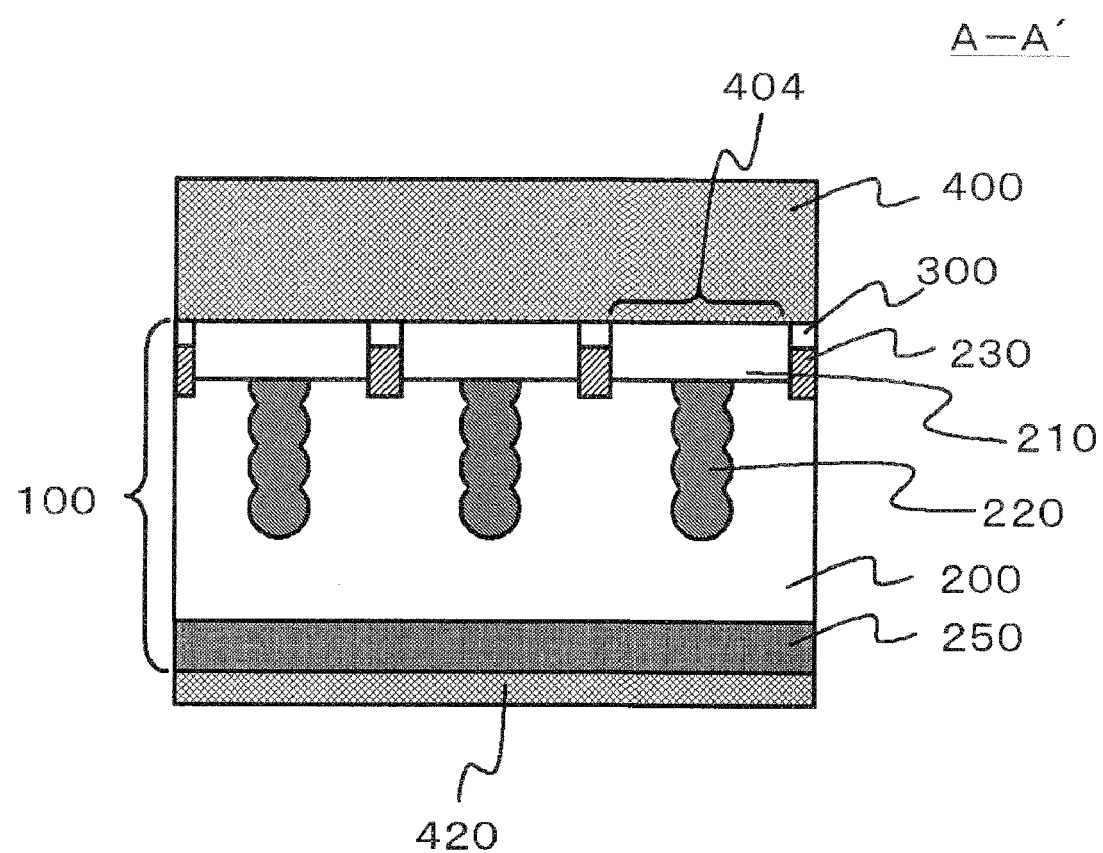
FIG. 10 is a sectional view taken along line A-A' in FIG. 9.
Figure 11:
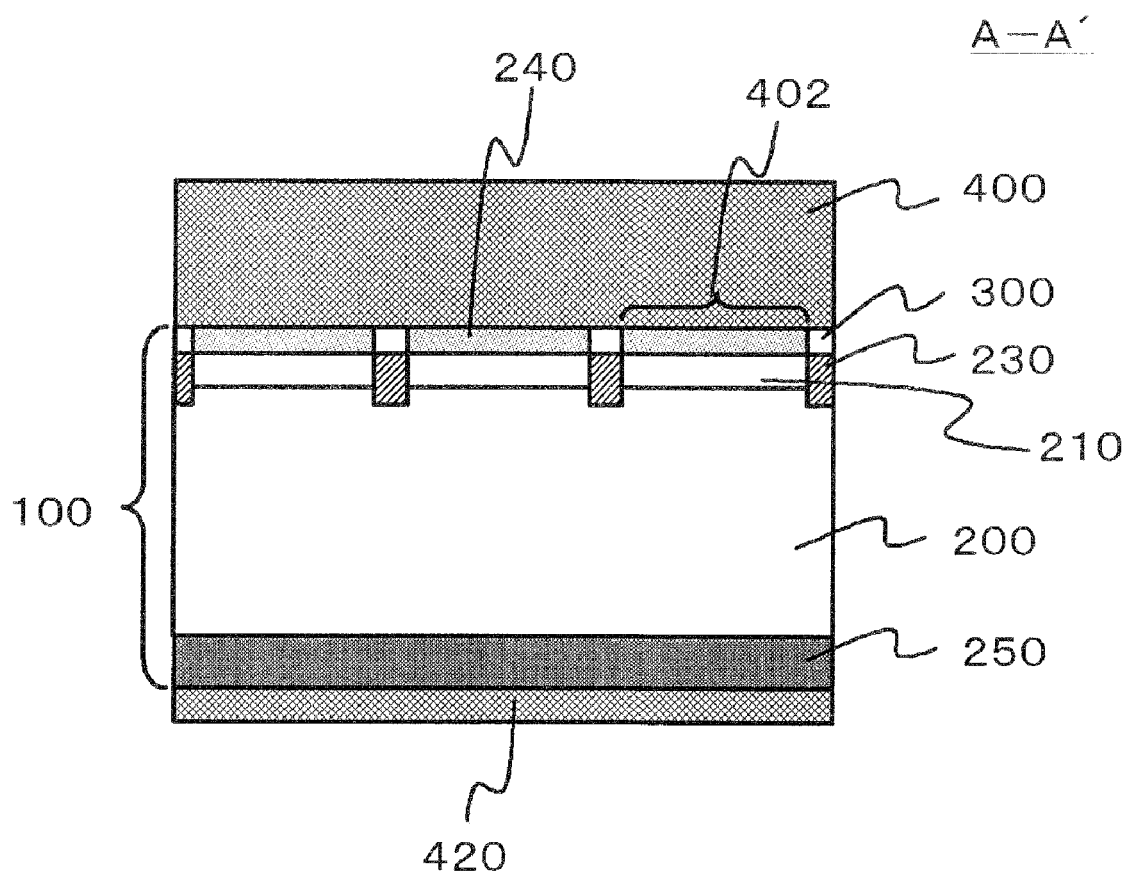
FIG. 11 is a sectional view taken along line B-B' in FIG. 9.

FIG. 9 is a plan view of a semiconductor device according to a fourth embodiment. FIG. 10 is a sectional view taken along line A-A' in FIG. 9, and FIG. 11 is a sectional view taken along line B-B' in FIG. 9. The semiconductor device is configured similarly to the semiconductor device of the third embodiment, except that the insulating film 300 is filled in the trenches of the trench gates 230.

Effects similar to those in the third embodiment may be obtained, by this embodiment. Since the insulating film 300 is filled in the trenches of the trench gates 230, the regions where the insulating film 300 has previously been stacked over the source regions 240 may be omissible. Accordingly, the semiconductor device may be shrunk in size, by narrowing the distance between the adjacent trench gates 230.

Figure 12:
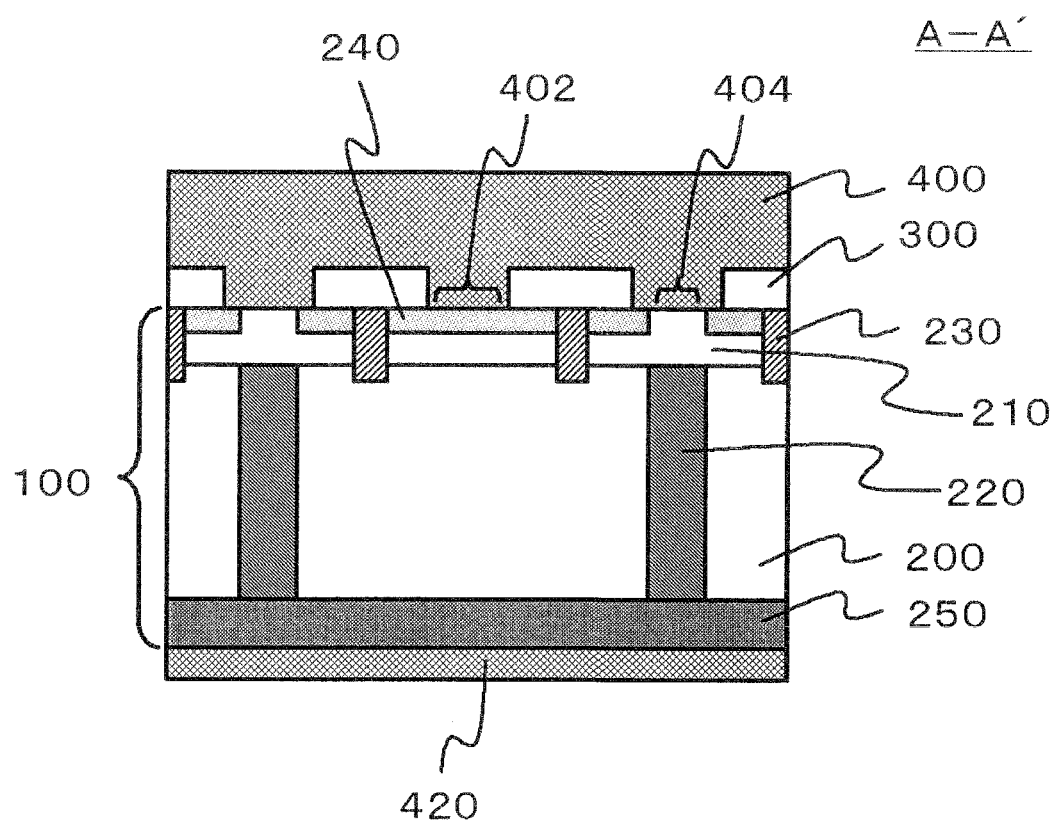
FIG. 12 is a sectional view of a semiconductor device according to a fifth embodiment.

FIG. 12 is a sectional view of a semiconductor device according to a fifth embodiment, and corresponds to FIG. 2 in the first embodiment. The semiconductor device is configured similarly to the first embodiment, except that the bottoms of the column regions 220 are brought into contact with the semiconductor substrate 250.

Effects similar to those in the first embodiment may be obtained, also by this embodiment. Since the depth of the column regions 220 is maximized, the interface between the column regions 220 and the epitaxial layer 200 is made deepest in the depth-wise direction of the epitaxial layer 200. Accordingly, the depletion layer which extends in the in-plane direction (transverse direction in the drawing) from the interface in the OFF time of transistor may be enlarged. The breakdown resistance of the semiconductor device may consequently be elevated.

Also in the second to fourth embodiments, the bottoms of the column regions 220 may be brought into contact with the semiconductor substrate 250 similarly to as in this embodiment. Also in these cases, the effects similar to those in this embodiment may be obtained.

Figure 13:
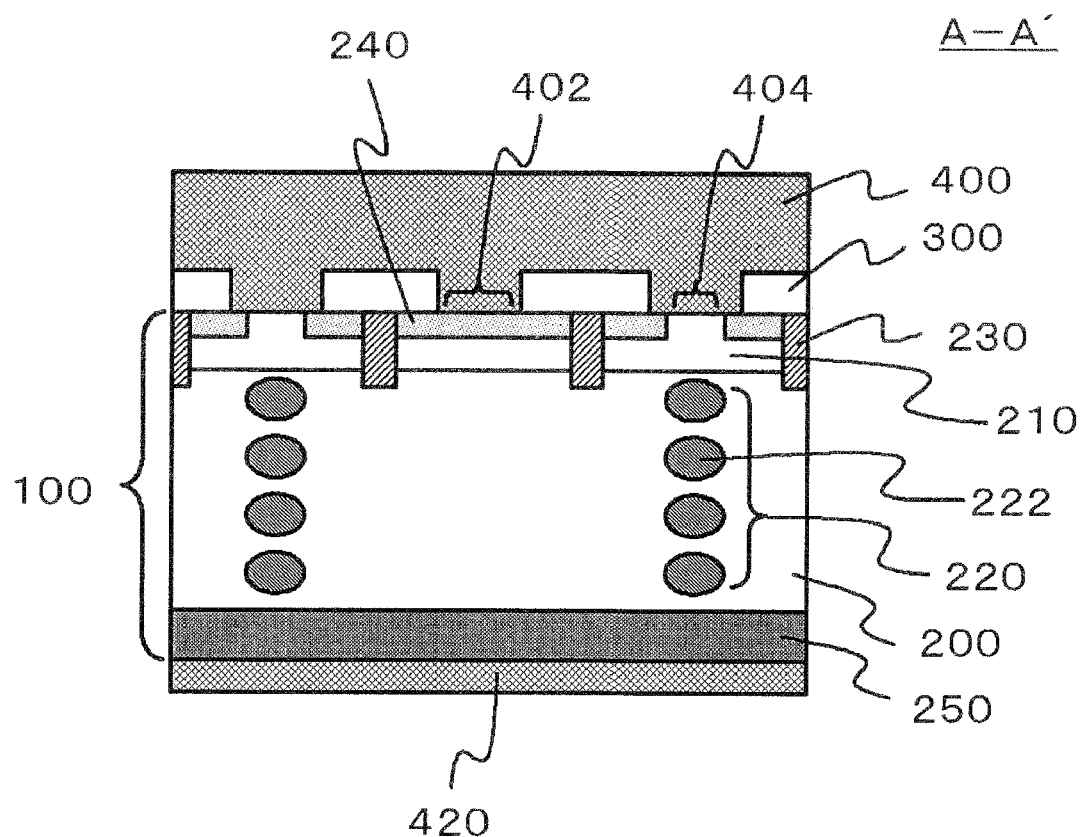
FIG. 13 is a sectional view of a semiconductor device according to a sixth embodiment.
Figure 14:
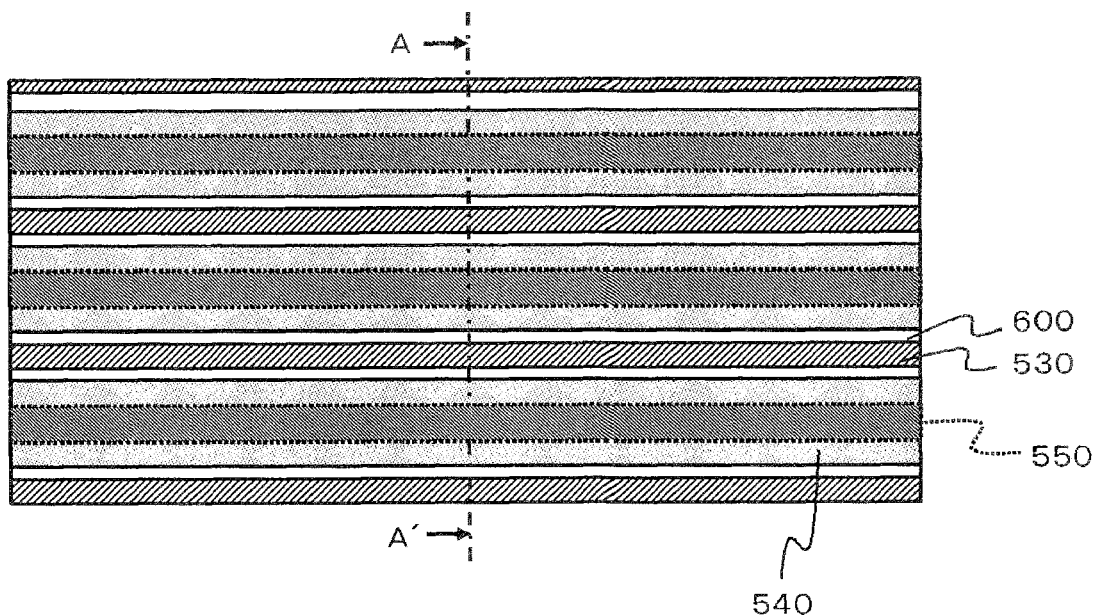
FIG. 14 is a plan view illustrating a transistor having the super-junction structure.
Figure 15:
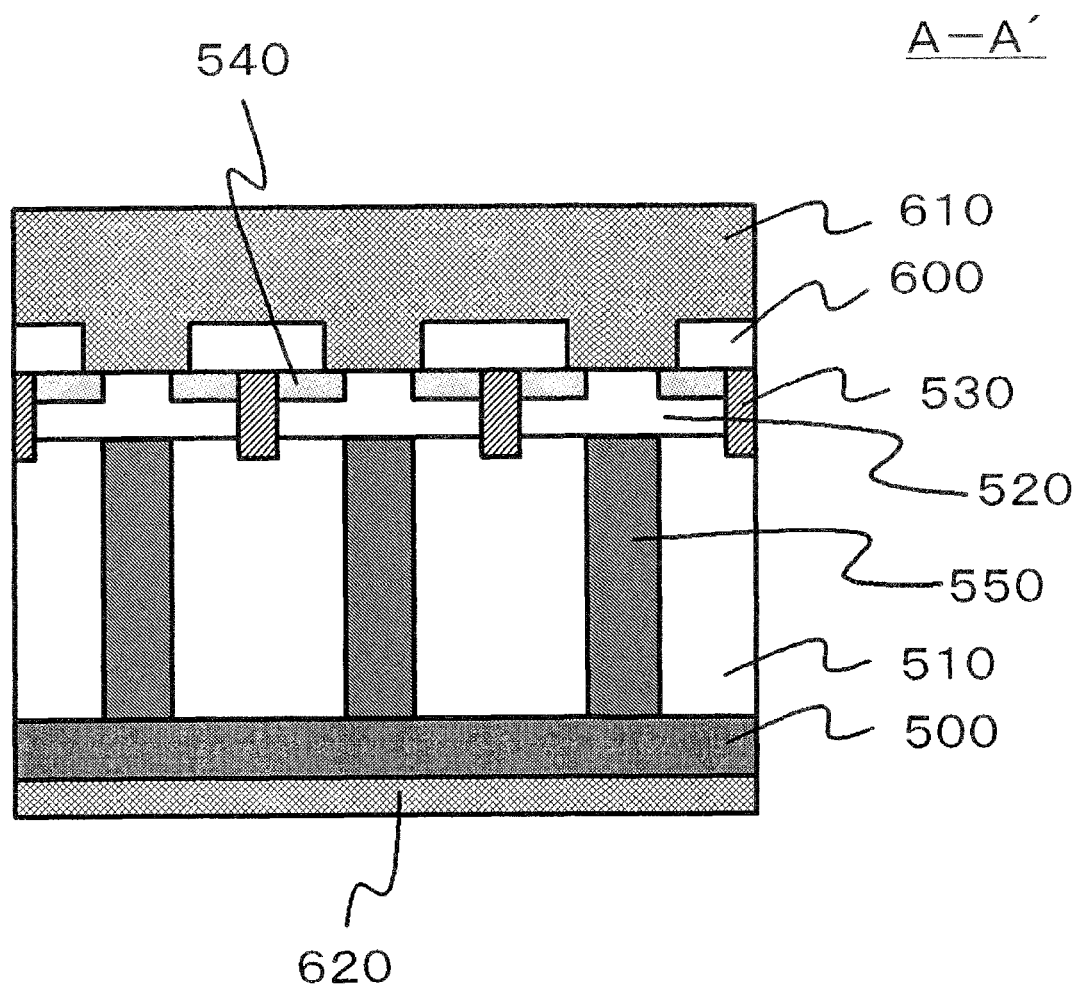
FIG. 15 is a sectional view taken along line A-A' in FIG. 14.

FIG. 13 is a sectional view of a semiconductor device according to a sixth embodiment, and corresponds to FIG. 2 in the first embodiment. The semiconductor device is configured similarly to the first embodiment, except for the geometry of the column regions 220. Each column region 220 in this embodiment is configured by a plurality of subcolumn regions 222. The plurality of subcolumn regions 222 are disposed at the same position in a plan view, and are spaced from each other in the depth-wise direction.

Effects similar to those in the first embodiment may be obtained, also by this embodiment. Since the plurality of subcolumn regions 222 are disposed so as to be spaced from each other in the depth-wise direction, so that, in the OFF state of the transistor, a depletion layer extends from each subcolumn region 222 in the in-plane direction and in the depth-wise direction. When the entire region of the epitaxial layer 200 is depleted, regions allowing therein the electric field, which is ascribable to acceptor ions in the individual subcolumn regions 222 and donor ions in the epitaxial layer

200, to be aligned in the same direction with a bias voltage applied between the source and the drain are formed at the interfaces of the individual subcolumn regions 222 and the epitaxial layer 200, and thereby the electric field may be enhanced at the regions. Accordingly, the impact ionization occurs at around the bottoms of the individual subcolumn regions 222, and thereby breakdown current may further be suppressed from flowing in the vicinity of the trench gates 230.

The paragraphs in the above have described the embodiments of the present invention referring to the attached drawings merely as examples of the present invention, while allowing adoption of various configurations other than those described in the above.

It is apparent that the present invention is not limited to the above embodiment, but may be modified and changed without departing from the scope and spirit of the invention.

What is claimed is:

1. A semiconductor device comprising:
   a substrate of a first conductivity type, having second-conductivity-type base regions on a first surface thereof;
   trench gates provided in the first surface of said substrate, disposed while being spaced from each other in a first direction in plan view;
   first-conductivity-type source regions formed in said first surface, and to a depth shallower than said base regions; and
   a plurality of second-conductivity-type column regions formed in said substrate and under said base regions, and located between two adjacent trench gates in plan view,
   wherein, between two adjacent trench gates, said plurality of column regions are disposed while being spaced from each other in a second direction normal to said first direction,
   the center of each column region falls on the center line between two adjacent trench gates in said first direction, and
   said column regions are not formed under said trench gates.
2. The semiconductor device as claimed in claim 1,
   wherein, in said second direction in plan view, said source regions are formed over a region between every adjacent ones of said plurality of column region.
3. The semiconductor device as claimed in claim 1,
   wherein, said source regions are not located between said column regions and said trench gates in the said first direction in plan view.
4. The semiconductor device as claimed in claim 1,
   wherein each of said plurality of column regions is composed of a plurality of subcolumn regions spaced from each other in a depth-wise direction.

* * * * *

UNITED STATES PATENT AND TRADEMARK OFFICE
CERTIFICATE OF CORRECTION

| | | |
|---|---|---|
| PATENT NO. | : 8,008,717 B2 | Page 1 of 1 |
| APPLICATION NO. | : 12/498774 | |
| DATED | : August 30, 2011 | |
| INVENTOR(S) | : Yoshiya Kawashima | |

It is certified that error appears in the above-identified patent and that said Letters Patent is hereby corrected as shown below:

On the title page, please amend Item (56) References Cited to read as follows:

--(56)  References Cited

FOREIGN PATENT DOCUMENTS
JP      2002-076339      3/2002
JP      2006-310621      9/2003

OTHER PUBLICATIONS

200V Trench Filing Type Super Junction MOSFET with Orthogonal Gate Structure, pp. 27-40, dated May 27-30, 2007.--

Signed and Sealed this
Twenty-eighth Day of May, 2013

Teresa Stanek Rea
*Acting Director of the United States Patent and Trademark Office*